US006639830B1

(12) United States Patent
Heide

(10) Patent No.: US 6,639,830 B1
(45) Date of Patent: Oct. 28, 2003

(54) MAGNETIC MEMORY DEVICE

(75) Inventor: Carsten Heide, Berlin (DE)

(73) Assignee: BTG International Ltd., London (GB)

( * ) Notice: Subject to any disclaimer, the term of this patent is extended or adjusted under 35 U.S.C. 154(b) by 0 days.

(21) Appl. No.: 10/278,005

(22) Filed: Oct. 22, 2002

(51) Int. Cl.$^7$ ................................................ G11C 11/00
(52) U.S. Cl. ........................ 365/158; 365/171; 365/173
(58) Field of Search .................................. 365/158, 171, 365/173; 324/252; 360/314, 324.2

(56) References Cited

U.S. PATENT DOCUMENTS

| | | | |
|---|---|---|---|
| 5,341,118 A | | 8/1994 | Parkin |
| 5,343,422 A | | 8/1994 | Kung |
| 5,573,809 A | | 11/1996 | Nix |
| 5,764,567 A | * | 6/1998 | Parkin .......................... 365/173 |
| 5,966,012 A | * | 10/1999 | Parkin .......................... 324/252 |
| 6,072,718 A | | 6/2000 | Abraham |
| 6,153,320 A | * | 11/2000 | Parkin .......................... 428/693 |
| 6,174,737 B1 | | 1/2001 | Durlam |
| 6,269,018 B1 | | 7/2001 | Monsma |
| 6,331,944 B1 | | 12/2001 | Monsma |
| 6,473,275 B1 | * | 10/2002 | Gill ............................. 360/314 |
| 6,538,859 B1 | * | 3/2003 | Gill ............................. 360/324.12 |
| 2002/0055190 A1 | | 5/2002 | Anthony |

FOREIGN PATENT DOCUMENTS

GB    2 343 308 A    5/2000

OTHER PUBLICATIONS

Grollier, et al., "Spin–polarized current induced switching in Co/Cu/Co pillars," Applied Physics Letters, American Inst. of Physics, vol. 78 (No. 23), p. 3663–3665, (Dec. 12, 2001).

* cited by examiner

*Primary Examiner*—Son T. Dinh
(74) *Attorney, Agent, or Firm*—Hahn Loeser + Parks LLP; Stephen L. Grant

(57) ABSTRACT

The invention relates to a magnetic memory cell for use in MRAM technology. The cell includes a first ferromagnetic fixed (hereinafter FMF) layer with a first magnetic moment, a second FMF layer with a second magnetic moment, at least one ferromagnetic soft (hereinafter FMS) layer with a third magnetic moment, said FMS layer being arranged between the first and second FMF layers, a first non-magnetic intermediate layer arranged between said first FMF layer and said FMS layer, and a second non-magnetic intermediate layer arranged between said second FMF layer and said FMS layer. Said first intermediate layer is adapted to allow a spin-polarized write current to pass between said first FMF layer and said FMS layer, said write current having an amount sufficient to change a relative orientation of said first and third magnetic moments. Said second intermediate layer is adapted to influence the resistance between said second FMF layer and said FMS layers at a predetermined read voltage in dependence on a relative orientation of said second and third magnetic moments, said read voltage creating a spin-polarized current amount lower than said write current amount. Said first and second magnetic moments are in a predetermined parallel or antiparallel alignment relative to each other.

11 Claims, 7 Drawing Sheets

MAGNETIC MEMORY DEVICE

Figure 1:
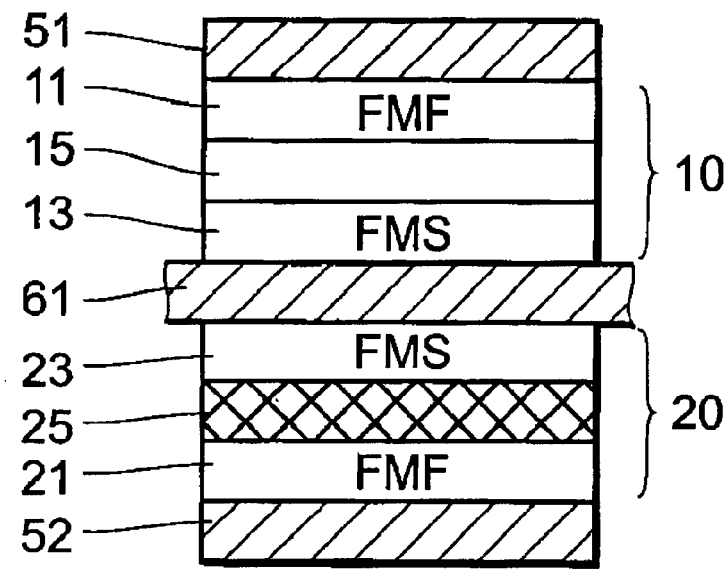

The invention relates to a magnetic memory cell and a memory comprising at least one magnetic memory cell.

Magnetic random access memories (MRAMs) have been proposed due to their non-volatile nature. Unlike dynamic random access memory (DRAM) cells, non-volatile memory cells such as MRAM cells do not require a complex circuitry for perpetual electronic refreshing of the stored Information.

The first of such MRAMs were based on magnetic multi-layer structures, deposited on a substrate. U.S. Pat. No. 5,343,422, for example, discloses a structure in which two layers of ferromagnetic material are separated by a layer of non-magnetic metallic conducting material. One of the magnetic materials, called the ferromagnetic fixed layer (FMF), has a fixed direction of magnetic moment, e.g., by having a particularly high coercive field or strong unl-directional anisotropy. The other magnetic layer, called the ferromagnetic soft layer (FMS), has a preferred axis for the direction of magnetisation, the so called easy-axis, which is aligned parallel to the magnetic moment of the ferromagnetic fixed layer. The magnetic moment of this ferromagnetic soft layer is free to change direction between parallel and anti-parallel alignment relative to the easy-axis, and as a consequence, also relative to the magnetic moment of the ferromagnetic fixed layer on application of an external magnetic field.

The state of the storage element represents a logical "1" or "0" depending on whether the directions of the magnetic moments of the magnetic layers are in parallel or anti-parallel alignment, respectively. Because the resistance of the storage element is different for different mutual orientations of the magnetic moments, the structure acts as a spin valve. It thus allows the sensing of the state of the storage element by measuring the differential resistance $\Delta R/R$ with a current, where $\Delta R$ is the difference in resistance of the storage element for two different states of relative orientation of the magnetic moments, and R is the total resistance of the structure in the lower resistance state.

A switching between these orientations can be achieved by passing write currents in the vicinity of the FMS, usually by using write lines which run past the layered structure on either side. These write currents, which do not pass through the layered structure Itself, induce a magnetic field at the location of the FMS which alters the orientation of the FMS, if it is stronger than the coercive field $H_C$ of the FMS.

An alternative is disclosed in U.S. Pat. No. 6,072,718. There, the conducting non-magnetic spacer layer between the two magnetic layers is replaced by an insulator. The device therefore forms a magnetic tunnel junction (MTJ), where spin polarised electrons tunnel through the insulator. The cell disclosed in U.S. Pat. No. 6,072,718 is written by sending simultaneously a current through the word and bit line crossing at the location of the cell. Each of these currents causes a magnetic field at the location of the memory cell. As the word lines and the bit lines are perpendicular to each other, the orientations of the magnetic fields caused by the currents at a crossing point of a bit line and a word line are perpendicular, too. One of both magnetic fields, the so called hard-axis field, extends parallel to the magnetic hard-axis of the ferromagnetic soft layer, while the other one of the magnetic fields, the so called easy-axis field, extends parallel to the magnetic easy-axis of the ferromagnetic soft layer.

In a write process, usually the hard-axis field, which stays perpendicular on the magnetic moment of the ferromagnetic soft layer, is applied to the ferromagnetic soft layer in order to move the magnetic moment out of its actual orientation and the easy-axis field Is used to set the new orientation of the magnetic moment with respect to the easy-axis of the ferromagnetic soft layer.

During a write process, all memory cells arranged in a first line will experience the same hard-axis while all memory cells arranged in a second line perpendicular to the first line will experience the same easy-axis field. The strength of both magnetic fields is chosen such that one of both fields alone is not able to switch a memory cell. Therefore, in an ideal memory array (i.e. all memory cells of the array show the same magnetic response to an applied magnetic field), only the memory cell which is located at the crossing of both lines experiences the hard-axis field as well as the easy-axis field and is therefore written. In contrary to the ferromagnetic soft layer, the ferromagnetic fixed layer has a coercivity that is high enough such that its magnetic moment is left unchanged in this process.

However, in an actual memory cell array, due to many factors related to manufacturing uncertainties and intrinsic magnetic variability, variations in the magnetic response throughout the memory cells in an memory cell array can be very large. Due to these variations, some of the memory cells may already be written if only one of the magnetic hard-axis field and the magnetic easy-axis field is applied. As a consequence, an array wide selectivity of the writing process is generally not achieved. The response variations are e.g. caused by tolerances during the manufacturing process, which for example may lead to differences in the surface roughness of different cells, which has an influence on the coercivity of the cell.

In GB 2 343 308, a magnetic storage device is disclosed, which comprises a first and a second ferromagnetic layer and a tunnel barrier which is disposed between both ferromagnetic layers. The first ferromagnetic layer is a ferromagnetic fixed layer whereas the second ferromagnetic layer is a ferromagnetic soft layer which can change the orientation of its magnetic moment. The device can be written directly by applying a voltage across the cell which can switch the orientation of the magnetic moment of the ferromagnetic soft layer with respect to the ferromagnetic fixed layer. The switching is effected by means of an induced exchange interaction between the ferromagnetic fixed layer and the ferromagnetic soft layer related to spin-polarised electrons tunnelling through the tunnelling barrier. Since the addressing of the cells in the write process is direct, array wide selectivity is achieved.

In GB 2 343 308, it is important for the write process to supply a strong enough tunnelling current to overcome the coercive field of the ferromagnetic soft layer. Therefore, the tunnel barrier has to be as thin as possible. Because the tunnelling current increases exponentially with decreasing thickness of the tunnelling layer, local variations due to the manufacturing process become particularly pronounced for thin barriers. The less uniform the current distribution within the cell, the higher the total current has to be to create a strong enough excitation throughout the entire ferromagnetc soft layer. However, a too strong a current will eventually break the tunnel junction. Therefore, in GB 2 343 308 materials for the tunnelling layer have been proposed with a low energy barrier. Nevertheless, from a manufacturing point of view, there is still a very strong a focus on the quality of the manufacturing process.

It is therefore an object of the invention to provide a memory cell that avoids the drawbacks of known memory cells with respect to writing and reading the cell.

The object is achieved by a magnetic memory cell comprising
- a first ferromagnetic fixed (hereinafter FMF) layer with a first magnetic moment,
- a second FMF layer with a second magnetic moment,
- at least one ferromagnetic soft (hereinafter FMS) layer with a third magnetic moment, said FMS layer being arranged between the first and second FMF layers,
- a first non-magnetic intermediate layer arranged between said first FMF layer and said FMS layer,
- and a second non-magnetic intermediate layer arranged between said second FMF layer and said FMS layer,
- wherein said first intermediate layer is adapted to allow a spin-polarized write current to pass between said first FMF layer and said FMS layer, said write current having an amount sufficient to change a relative orientation of said first and third magnetic moments, and
- wherein said second intermediate layer is adapted to influence the resistance between said second FMF layer and said FMS layers at a predetermined read voltage in dependence on a relative orientation of said second and third magnetic moments, said read voltage creating a spin-polarized current amount lower than said write current amount,
- and wherein said first and second magnetic moments are in a predetermined parallel or antiparallel alignment relative to each other.

The memory cell of the invention combines the benefits of known types of magnetic memory cells, while eliminating their drawbacks.

The memory cell according to the invention comprises two cell sections: a first cell section has the first FMF layer, the FMS layer, and the first intermediate layer between the first FMF layer and the FMS layer. A second cell section includes the second FMF layer, the FMS layer, and the second intermediate layer between the second FMF layer and the FMS layer. A ferromagnetic fixed layer is a layer with a coercive field high compared to that of a ferromagnetic soft layer.

The cell sections provide different main functionalities in the memory cell of the invention. The first cell section primarily serves for writing the cell. Writing means changing the relative orientation of the magnetic moments of the first and third magnetic moments, that is, of the first FMF layer and the FMS layer. It will be explained below how writing of the memory cell can be accomplished. The second cell section primarily serves for reading the cell. Reading, in the current context, means ascertaining the relative orientation of the second and third magnetic moments.

Since the relative orientation of the magnetic moments of the first and second FMF layers is fixed in the memory cell of the invention, knowing the relative orientation of the second and third magnetic moments implies the knowledge of the relative orientation of the first and third magnetic moments. Therefore, the state of the memory cell as written with the aid of the first cell section can be determined from a measurement of the relative mutual orientation of the second and third magnetic moments in the second cell section.

It is noted that for purposes of clear language the above definition of the memory cell of the invention mentions only once that at least one FMS layer may be provided in the cell. Each further reference to "the" FMS layer in the above definition, the description, and in the claims is to one or more FMS layers as well, unless the number of FMS layers is made clear otherwise in the respective context. Thus, according to the invention one or more FMS layers may be provided in the memory cell.

In an embodiment comprising only one FMS layer, this FMS layer is shared by the first and second cell sections. Sharing an FMS layer in this context means that the respective layer is used in the writing as well as in the reading process.

In an embodiment comprising two FMS layers, each cell section preferably has one FMS layer. It is important that, in an embodiment comprising more than one FMS layer, the FMS layers are mutually coupled by a magnetostatic interaction. This coupling effects an antiparallel alignment of the orientation of the FMS layers of the first cell section and the second cell section. This coupling is accomplished by providing a FMS layer in the first cell section that has a magnetic moment sufficiently high to Impose on the magnetic moment of the FMS layer in the second cell section, given a distance between the two FMS layers. A lower magnetic moment in the FMS layer in the first cell section is needed for a smaller distance between the FMS layers. Thus, both parameters can be adjusted to achieve an optimized cell design. However, as a boundary condition, the magnetic moment of the FMS layer in the first cell section has to be small enough to allow changing this magnetic moment with the aid of the writing current in the first cell section.

In the embodiment comprising two FMS layers, the FMS layer in the first cell section is used for writing the memory cell. Writing the FMS layer in the first cell section, however, implies writing the second FMS layer in the second cell section due to the magnetostate coupling of these two layers. Therefore, the magnetic moment of the FMS layer in the second cell section always reflects the information contained in the magnetic moment of the FMS layer of the first cell section of the memory cell of the invention.

An MTJ cell section is used to read the state of the MTJ cell section, i.e., to ascertain the relative orientation of the magnetic moments of the ferromagnetic fixed and soft layers of magnetic memory cell. The coupling between the cell sections makes sure that both cell sections share the same state. Sharing the same state means that there is a unequivocal relation between the relative orientation of the magnetic moments.

In the following, a number of embodiments based on the above described memory cell of the invention are disclosed.

A first embodiment, wherein respective extensions of said first FMF layer, said first intermediate layer, and said FMS layer in a direction perpendicular to the layer planes, as well as the respective materials of these layers are such as to allow a change of an orientation of said first and third magnetic moments relative to each other with the aid of a current of at least said writing current amount.

A second embodiment, wherein respective extensions of said second FMF layer, said second intermediate layer, and said FMS layer in a direction perpendicular to the layer planes, as well as the respective materials of these layers are such as to form, given a predetermined writing voltage applied across these layers, a low ohmic resistance if the second and third magnetic moments are in parallel alignment, and to form a high ohmic resistance if the second and third magnetic moments are in antiparallel alignment.

A third embodiment, wherein said second FMF layer, said second intermediate layer, and said FMS layer form a magnetic tunnel junction.

A fourth embodiment, comprising a current selection element adapted to allow a current of up to at least a predetermined writing current amount to pass across the first FMF, the first intermediate layer and the FMS layer in directions perpendicular to the layer planes, and a reading current amount to pass across the first second FMF layer, the second intermediate layer and the FMS layer in one direction perpendicular to the layer planes at a predetermined reading voltage.

A fifth embodiment, comprising a first FMS layer and a second FMS layer, wherein the magnetic moments of said first and second FMS layers are coupled to each other by magnetostatic interaction.

A sixth embodiment, wherein said FMS layers are separated by a conductive layer.

A seventh embodiment, comprising a first current selection element and a second current selection element, said first current selection element contacting said first FMF layer and said second current selection element contacting said second FMF layer, wherein said first current selection element is adapted to allow a current of up to at least a predetermined writing current amount to pass across the first FMF, the first intermediate layer and the first FMS layer in directions perpendicular to the layer planes, and wherein said second current selection element is adapted to allow a reading current amount to pass across the second FMF layer, the second intermediate layer and the second FMS layer in one direction perpendicular to the layer planes at a predetermined read voltage applied across these layers.

An embodiment of a memory according to the invention comprises at least one memory cell according to the fifth embodiment, wherein the conductive layer is a word line or a bit line.

In the following, the invention will be further elucidated by the description of further embodiments with reference to the figures.

Figure 2:
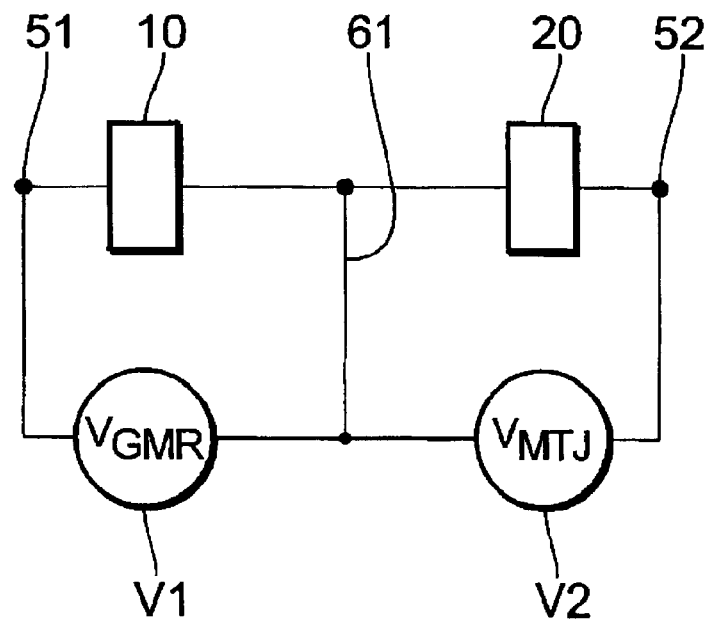
Figure 3:
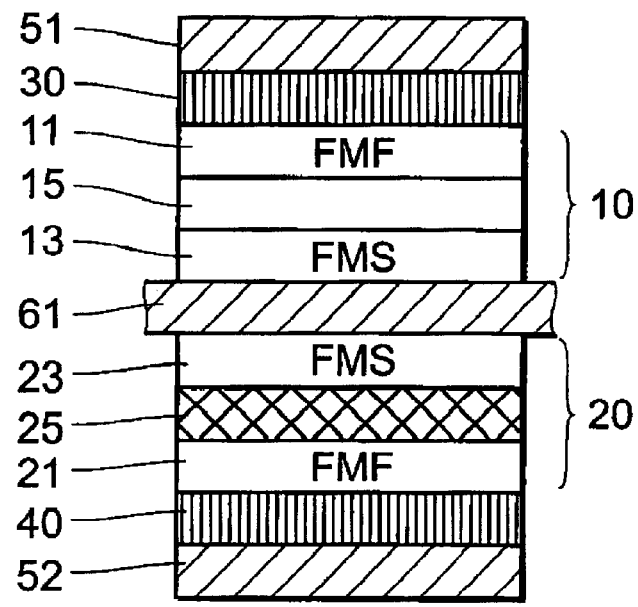
Figure 4:
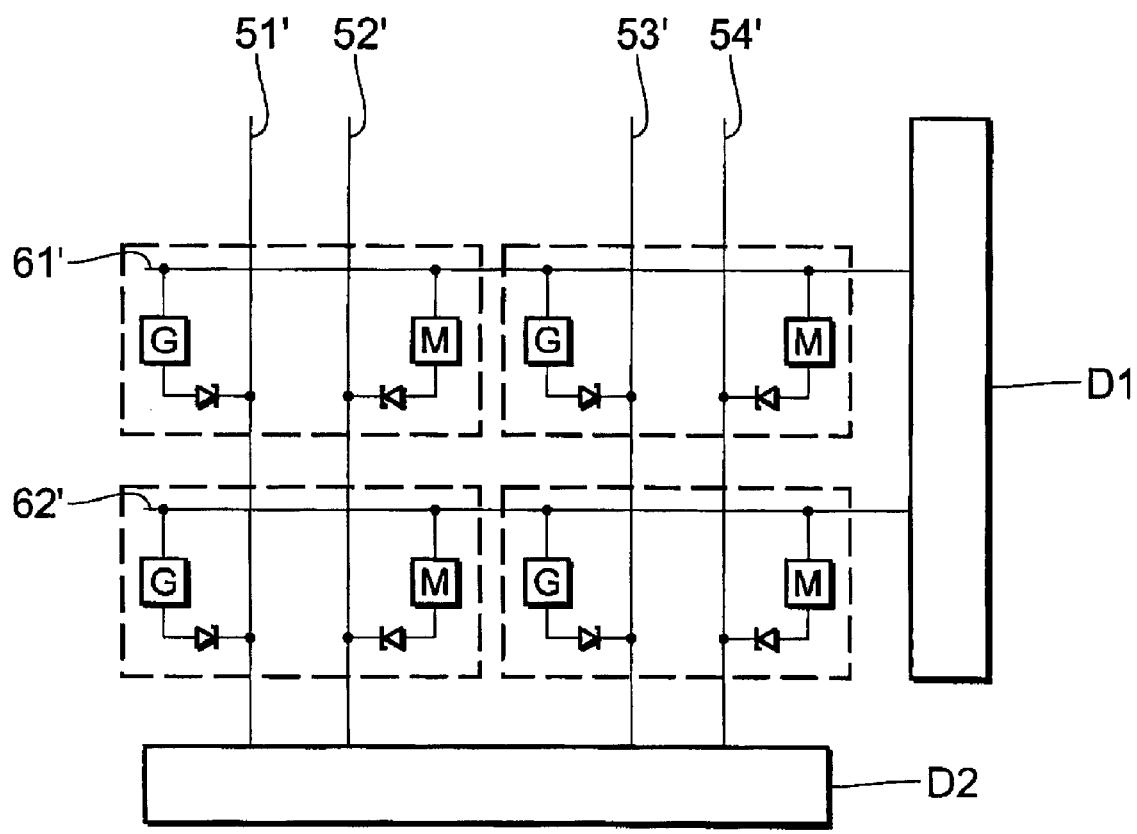
Figure 5A:
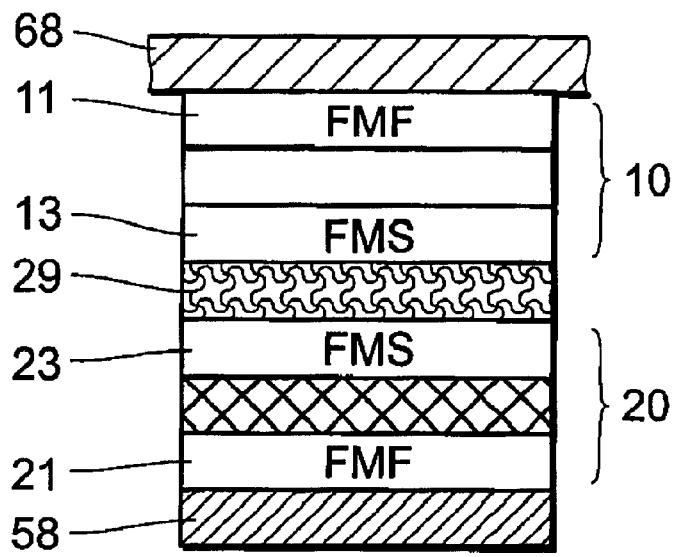
Figure 5B:
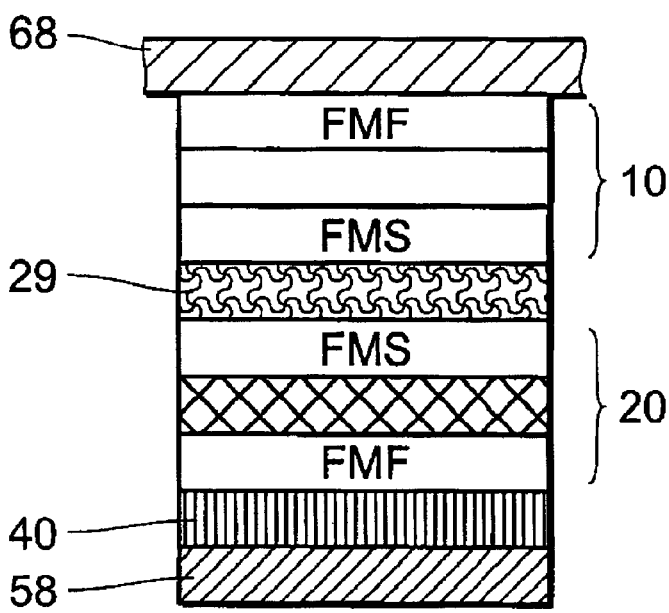
Figure 6A:
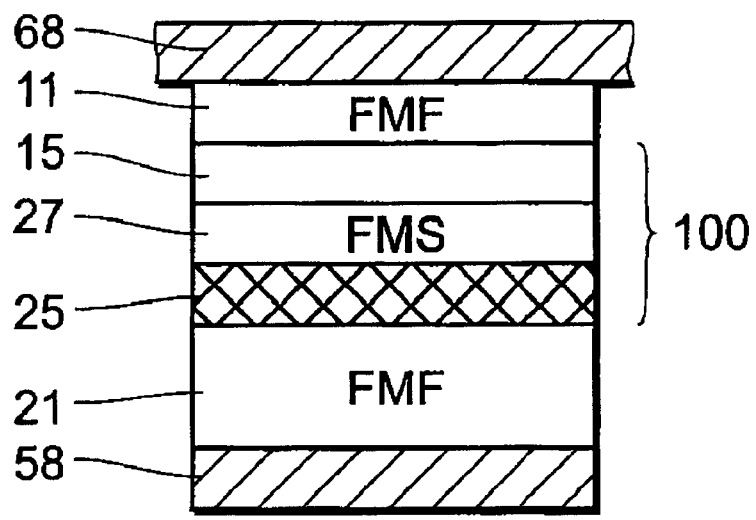
Figure 6B:
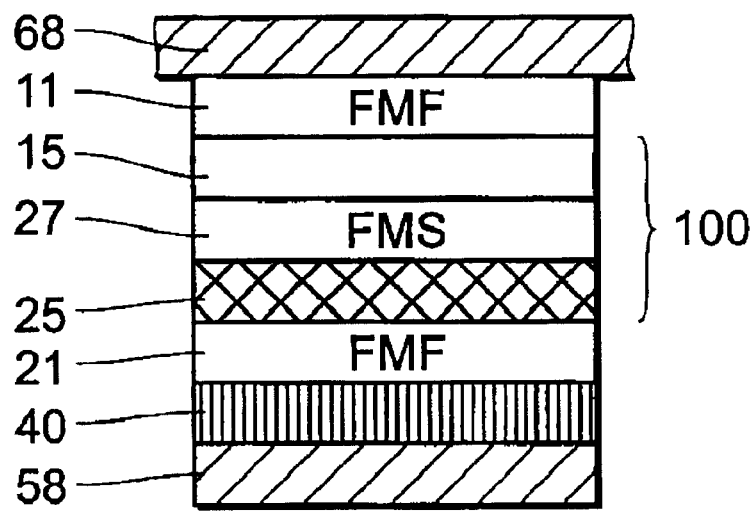
Figure 7:
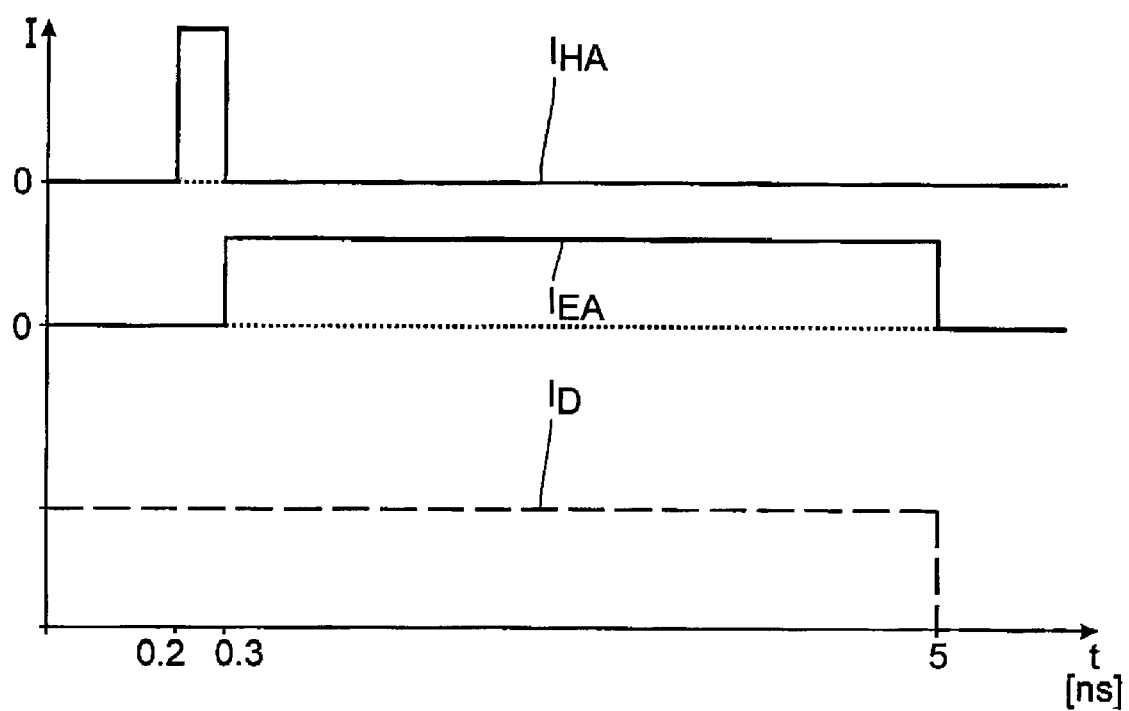
Figure 8:
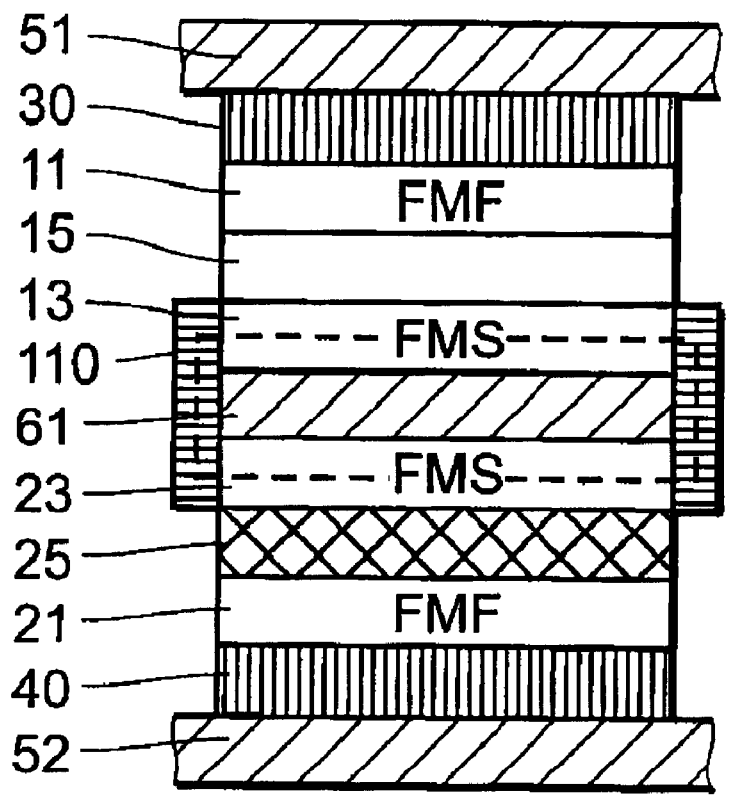
Figure 9:
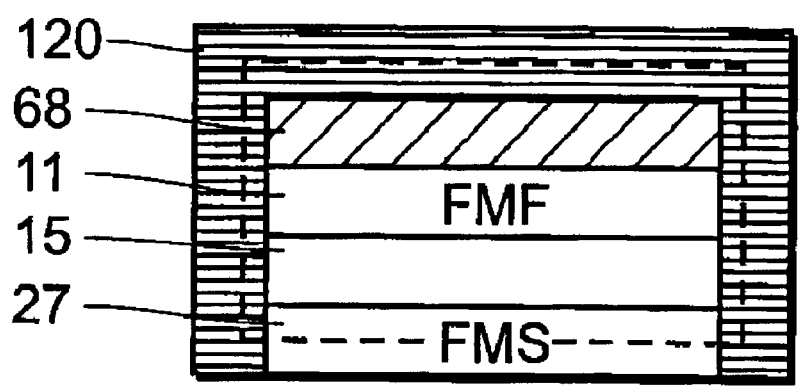
Figure 10:
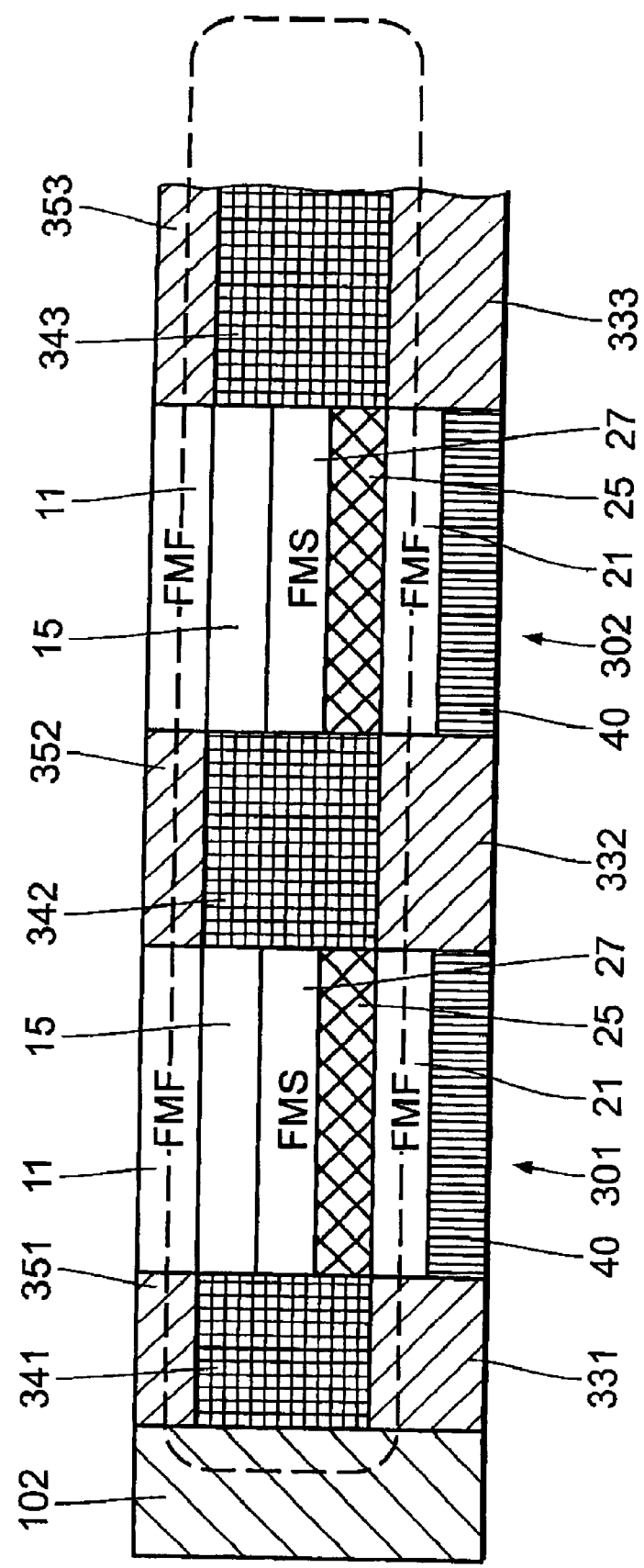

FIG. 1 shows a first embodiment of a memory cell in a cross sectional view,

FIG. 2 shows a schematic circuit diagram for read/write operations with the memory cell of FIG. 1, FIG. 3 shows a cross sectional view of the first embodiment of a memory cell as to be integrated into a memory cell array, FIG. 4 shows a circuit diagram for an array of memory cells, FIG. 5A shows a second embodiment of a memory cell in the form of a tow-terminal device, FIG. 5B shows the second embodiment of a memory cell as to be integrated into a memory cell array, FIG. 6A shows a third embodiment of a memory cell, FIG. 6B shows the third embodiment of a memory cell as to be integrated into a memory cell array, FIG. 7 shows a schematic timing diagram for an exemplary process of switching the magnetic moment of a ferromagnetic soft layer in a memory cell, FIG. 8 shows the embodiment of FIG. 3 with a flux closure structure in a second cross sectional view, FIG. 9 shows a partial, cross sectional view of a further embodiment of a memory cell with a flux closure structure, and FIG. 10 shows a cross sectional view of an array of memory cells with a flux closure structure.

FIG. 1 shows a first embodiment of a memory cell. Only the basic structure of the memory cell is shown. Especially, not all structural elements needed to integrate the memory cell into an array and to allow writing and reading the cell are shown. This will be addressed below in the context of the description of FIGS. 2 and 3.

The memory cell comprises a first cell section 10 comprising a first ferromagnetic fixed layer 11, a first ferromagnetic soft layer 13 and a non-magnetic layer 15 sandwiched between the first ferromagnetic fixed layer 11 and the first ferromagnetic soft layer 13. The first cell section will hereinafter also be referred to as the GMR cell section.

As materials for the first ferromagnetic fixed layer 11 and the first ferromagnetic soft layer 13 all materials showing a giant magnetoresistance effect may in principle be used. Such materials comprise for example the ferromagnetic elements cobalt (Co), iron (Fe). nickel (Ni) and ferromagnetic alloys containing these elements and iron zirconium (FeZr). The magnetic moment of the first ferromagnetic fixed layer 11 may be pinned by using an anti-ferromagnet or preferably a synthetic antiferromagnetic structure, e.g. a sandwich structure with layers of cobalt and copper.

In any case, the first ferromagnetic fixed layer 11 should be made such as to have a high coercive field with respect to the first ferromagnetic soft layer 13. This can either be achieved by making the first ferromagnetic fixed layer rather thick with respect to the thickness of the first ferromagnetic soft layer, or by choosing a material having a high intrinsic coercive field (so called hard ferromagnetic material). On the other hand, the first ferromagnetic soft layer should be made from a material having a coercive field which is considerably smaller than the coercive field of the first ferromagnetic fixed layer. This can be achieved by giving the soft layer a considerably smaller thickness than the thickness of the first ferromagnetic fixed layer (in particular, if both layers consist of the same material) or by choosing a material for the first ferromagnetic soft layer which has a small intrinsic coercive field.

In particular, nickel, doped ferromagnetic semiconductor materials such as GeMn or GaAsMn (Ge: germanium, Ga: gallium, As: arsenic, Mn: manganese), or a combination of a metallic ferromagnetic material and a ferromagnetc semiconductor material may be chosen for the first ferromagnetic soft layer. Useful combinations of ferromagnetic metallic and ferromagnetic semi-conductor materials may be layer stacks like GeMn/NiFe/GeMn, NiFe/GeMn/NiFe, Fe/FeSi/Fe (Si:silicon), or Fe(Ni)Zr/CROW/Fe(Ni)Zr (Zr: zirconium).

Copper (Cu), or chromium (Cr) may, for example, be used as materials for the non-magnetic low-resistance, hereinafter also called conductive layer 15. The first ferromagnetic fixed layer 11 and the first ferromagnetic soft layer 13 are fabricated to have easy axes of magnetisation that align with each other. By using for the first ferromagnetic fixed layer 11 a material with a particularly high anisotropy, such as Co—Pt—Cr alloy (Pt: platinum), the direction of magnetisation of the easy axis of the first ferromagnetic fixed layer is fixed against the one of the first ferromagnetic soft layer 13. Alternatively, the direction of magnetisation of the first ferromagnetic fixed layer 11 can be set by an unidirectional anisotropy as described, for example, in U.S. Pat. No. 5,465,185.

The magnetic moment of the first ferromagnetic soft layer 13 may adopt two possible orientations along its easy axis, which define the two states of the memory cell, namely parallel or anti-parallel to the magnetic moment of the first ferromagnetic fixed layer. In addition, the first ferromagnetic soft layer 13 may be fabricated to have a low coercivity by giving It an elliptical, a hexagonal or an octagonal shape, or forming tapers at the comers in order to suppress the effects of edge domains.

Additional layers may be provided in all layer stacks of the GMR cell section 10, for example in order to reduce lattice mismatch throughout a stack or between neighbouring stacks.

The memory cell further comprises a second cell section 20. The cell section 20 has a second ferromagnetic fixed layer 21, a second ferromagnetic soft layer 23, and an insulaton layer 25. The second cell section 20 will hereinafter also be referred to as the MTJ cell section. The structure of the MTJ cell section 20, the materials and the respective thickness of the individual layers, are those used in Magnetic-Tunnel-Junction memory cells known In the art.

The memory cell is in contact with two bit lines 51 and 52 and one word line 61. It is noted that the names word line and bit line for the lines may be interchanged. The attribution of the names is chosen arbitrarily. This will be described in more detail In the following. The FMF layer 11 of cell section 10 is in contact with the first bit line 51. Between the first bit line 51 and the ferromagnetic fixed layer 11 may be provided an additional contact layer (not shown) which may be made, e.g., of copper or platinum. The FMS layer 13 is in contact with word line 61. An additional contact layer may be provided between FMS layer 13 and word line 61 as well.

Word line 61 is, on the other side, also in contact with FMS layer 23 of the second cell section 21. Thus, word line 61 Intersects the memory cell between the GMR section 10 and the MTJ section 20. The second bit line is in contact with the FMF layer 21 of the MTJ section 20.

The function of the memory cell of this embodiment will now be described with additional reference to FIG. 2.

FIG. 2 shows a circuit diagram for read/write operations with the memory cell of FIG. 1 The same reference numerals are used In FIG. 2 for elements identical with those of FIG. 1. The diagram is an equivalent electrical circuit diagram for explanatory purposes. It does not show the physical structure of the memory cell of FIG. 1 nor does it show a circuit used for reading and writing a memory array.

GMR cell section 10 and MTJ cell section 20 are shown in FIG. 2 as simple blocks. Also shown are the first and second bit lines 51 and 52, and the word line 61. The bit lines 51 and 52 would extend perpendicularly to the plane of the diagram of FIG. 2 in an actual circuit for a memory array.

Two voltage sources V1 and V2 are provided. Voltage source V1 is connected with bit line 51 on one side and with word line 61 on the other side. A first closed circuit section is formed comprising a first output port of voltage source V1, bit line 51, GMR cell section 10, word line 61, and a second output port of voltage source V1. Voltage source V2 is connected with bit line 52 on one side and word line 61 on the other side. A second closed circuit section is formed comprising a first output port of voltage source V2, bit line 52, MTJ cell section 20, word line 61 and a second output port of voltage source V2. The second output ports of voltage source V1 and V2 share a common electrical potential.

For writing the memory cell, a write current is generated in the first circuit section leading through GMR cell section 10 by generating an appropriate voltage between the output ports of voltage source V1. The sign of the voltage to be applied depends on the current state of the cell, i.e., the relative orientation of the magnetic moments of FMF layer 11 and FMS layer 13. The write current leading through the cell can in a further embodiment be supported by a current passing by the cell. This will be explained below with reference to FIG. 7.

When applying the write current, non-polarized electrons are led through the cell section 10 become spin-polarized when passing through the ferromagnetic fixed layer 11 of the GMR cell section 10. That means, the spin of the electrons will be aligned in parallel orientation with respect to the magnetic moment of the ferromagnetic fixed layer after they have passed through this layer. In the alternative case where electrons are reflected from the FMF layer, for instance, when a voltage of opposite sign is applied, they will be in anti-parallel alignment with the magnetic moment of the FMF layer. In the current flowing through the memory cell the number of electrons having a spin which is aligned in parallel or anti-parallel, respectively, to the magnetic moment of the ferromagnetic fixed layer 11 is higher than the number of electrons having a spin in anti-parallel or parallel orientation, respectively, with respect to the magnetic moment of the ferromagnetic fixed layer 11. The spin polarisation, i.e. the difference between the number of electrons with spin aligned parallel and spin aligned anti-parallel with respect to the ferromagnetic fixed layer's magnetic moment, is related to a solled exchange field $H_E$ which interacts with the ferromagnetic soft layer 13. If the spin polarisation is high enough, the interaction of the exchange field $H_E$ with the ferromagnetic soft layer 13 is strong enough to switch the orientation of the magnetisation of this layer. Switching by leading a current through the memory cell is referred to as direct switching.

The degree of spin polarisation reduces with the length of the way the electrons have to pass through the non-magnetic layer 15. Therefore, the non-magnetic layer 15 should have a thickness which is small enough not to reduce the degree of spin polarisaton so much that the exchange interaction Is unable to change the orientation of the magnetic moment of the ferromagnetic soft layer 13 with respect to the magnetic moment of the ferromagnetic fixed layer 11. Depending on the material used for the non-magnetic layer 15, this layer may have a thickness up to more than 100 nm.

On the other hand, the nonmagnetic layer 15 should be thick enough to prevent a permanent coupling of the orientation of the ferromagnetic soft layer's magnetic moment to the ferromagnetic fixed layer's magnetic moment. To achieve this, the non-magnetic layer 15 should, depending on the material, have a thickness of more than about 50 Å. However, the coupling strength between the ferromagnetic fixed layer 11 and the ferromagnetic soft layer is not constant but depends on the thickness of the non-magnetic, preferably conductive layer 15. This dependency results in different ratios $H_{sat}/H_{AP}$ of the magnetic saturation field $H_{sat}$ to the magnetic field $H_{AP}$ in case of anti parallel alignment of the magnetic moments of the ferromagnetic layers for different thicknesses of the non-magnetic layer 15. If, for example, both ferromagnetic layers 11, 13 consist of cobalt and the non-magnetic layer 15 consists of copper, the $H_{sat}/H_{AP}$-ratio, at about 8 Å a first maximum in the $H_{sat}/H_{AP}$-ratio occurs. This maximum means that the magnetic moments of both ferromagnetic layers are coupled in antiparallel orientation. On the other hand a minimum in the $H_{sat}/H_{AP}$-ratio occurs at about 10–15Å, which means that the magnetic moments of the ferromagnetic layers are coupled in parallel orientation. Between the maximum and the minimum, i. e., at about 9 Å, no fixed coupling of the magnetic moments of both ferromagnetic layers exists. Therefore, a thickness between a maximum and a minimum may also be chosen as a thickness for the non-magnetic layer 15. In the cobalt-copper-system such a thickness would be about 9 Å, about 17 Å, or about 22 Å. The coupling between the magnetic moments of the ferromagnetic layers becomes negligible above a thickness of about 30 Å.

Correlation of the magnetic states of the GMR cell section 10 and the MTJ cell section 20 is established by a magnetostatic coupling of the FMS layers 13 and 23. Due to the coupling the FMS layers will always have an anti-parallel alignment of their magnetic moments. Thus, when the magnetic moment of the FMS layer 13 is switched, the magnetic moment of the FMS layer 23 will switch by interaction with the new magnetic moment of FMS layer 13.

To accomplish the coupling, FMS layer 13 may for instance have a higher magnetic moment than FMS layer 23, e.g., by choice of respective layer thickness or layer material. FMS layer 23 may also have a lower coercive field than FMS layer 13 in order to enhance the coupling. In addition, the thickness of the word line 61 is kept small enough not to prevent a coupling. However, care must be taken in the design of the cell structure with respect to the coupling of the FMS layers not to Impede the electrical function of the MTJ section in the reading process, which will be described in the following. For instance, a magnetostatic coupling of FMS layer 23 to FMF layer 21 must be avoided.

For reading the memory cell, a read voltage is applied in the second circuit section leading through MTJ section 20 by generating an appropriate voltage between the output ports of voltage source V2.

Depending on the state of the cell, i.e., the relative orientation of the magnetic moments of FMF layer 21 and FMS layer 23, the resistance of the MTJ cell section 20 is high or low. Electrons passing the FMF layer 21 are spin-polarized as described above for FMF layer 11. If the magnetic moments of the FMF layer 12 and the FMS layer 23 are in parallel alignment, the potential barrier represented by the insulating (or high-resistance) layer 25 is small enough to allow a substantial amount of spin-polarized electrons to tunnel through this layer. The parallel alignment of the magnetic moments therefore constitutes the low-resistance state of the MTJ cell section 20. If, on the other hand, the alignment of the magnetic moments is anti-parallel, the potential barrier is high enough to substantially decrease the tunneling probability for the spin-polarized electrons. This is reflected by an increased ohmic resistance of the MTJ cell section 20. The anti-parallel alignment of the magnetic moments therefore constitutes the high-resistance state of the MTJ cell section 20.

In the following, the write and read processes in a memory cell incorporating the embodiment of FIG. 1 will be described in further detail with respect to FIGS. 3 and 4.

FIG. 3 shows a cross sectional view of the first embodiment of a memory cell as to be integrated into a memory cell array. In addition to the structural elements described with reference to FIG. 1, which are given the same reference numbers as above, the memory cell of this embodiment comprises a first current selection element 30 and a second current selection element 40.

Current selection element 30 is incorporated in the memory cell between bit line 51 and GMR cell section 10, contacting the FMF layer 11. Current selection element 30 is a Zener diode. It is formed on or in a semiconductor substrate such as silicon (Si) and contains p- and n-doped layers which are e.g. formed of Silicon. A pn-junction is formed between the p-doped and the n-doped layers. The Zener-diode can be operated through a reverse breakdown voltage in the avalanche breakdown region. The Zener-diode accommodates two operational regimes. One regime for the read operation and the other one for write operations where, for writing at least one of the two possible logical states, a reverse voltage has to be applied to the Zener-diode that exceeds the breakdown voltage.

Instead of a Zener-diode, any other current control or current selection device with an I-V-characteristics or operational regime similar to a Zener-diode may be used. E.g., a double barrier structure, such as a transistor, may be used. It is essential, however, that current selection element 30 has the following characteristics: it allows a current of up to at least a predetermined writing current amount to pass across the GMR cell section between bit line 51 and word line 61, and prohibits a current to pass across the cell in a second direction opposite to said first direction, unless the current amount in the second direction is higher than a predetermined reading current amount, which reading current amount is lower than said writing amount. This makes sure that the cell can be written in both directions, i.e., depending on the previous state of the cell an appropriate current direction can be chosen to change the orientation of FMS layer 13. On the other hand, reading currents are to be passed through MTJ cell section 20 of the addressed cell only, not through GMR cell section 10 nor through other cells In a memory cell array. Also, reading only requires one current direction in the MTJ element. The current selection device 30 should therefore be adapted to prohibit a flow of a reading current though the GMR cell section 10 when the reading current is to be passed through MTJ cell section 20.

The second current selection element 40 may be a Zener diode as well. However, it has different current-voltage characteristics than current selection element 30. Current selection device 40 is adapted to allow a current flow in one direction perpendicular to the layer planes, such that the current is influenced substantially by the magnetic tunnel junction effect described above. "Substantially" means in this context, that the contrast between the two resistance states of the MTJ section described earlier Is high enough to be detected reliably in an electrical measurement. The reading voltage to be applied to the magnetic tunnel junction is low enough to fall within the range of voltages that create a current amount through word line 61 that is below the writing current amount as described above for the current selection device 30. Therefore, there is no current through the first cell section 10 in a read process due to the characteristics of current selection element 30.

FIG. 4 shows a circuit diagram for an array of memory cells, The memory cells used here are those of the embodiment of FIG. 3. Four memory cells are shown. Each is indicated by a rectangle with dashed outlines. Each memory cell has two cell sections. A first cell section indicated by a block labeled G is the GMR cell section 10 of the cell of FIG. 3. The GMR cell section is connected to the circuit symbol of a Zener diode, referencing to the current selection element 30. GMR cell section G and the pertaining Zener diode are connected between a write bit line 51' and word line 61'. A second cell section indicated by a block labeled M is the MTJ cell section 20 of FIG. 3. The GMR cell section is connected to the circuit symbol of a Zener diode, referencing to the current selection element 40. MTJ cell section M and the pertaining Zener diode are connected between a read bit line 52' and word line 61'.

In a similar manner, a second memory cell is provided along the word line 61', being connected to a write bit line 53' and a read bit line 54'. A third memory cell is provided along bit lines 51' and 52', being further connected to a word line 62'. A fourth memory cell is provided along word line 62', and is further connected to bit lines 53' and 54'.

Word lines 61' and 62' are connected to respective output ports (not shown) of a word line driver D1. Bit lines 51' through 54' are connected to respective output ports of a bit line driver D2.

Addressing for writing or reading from a selected memory cell is follows a matrix system well known in the art with one important modification. There are two bit lines provided for each memory cell, one for writing and one for reading. For instance, bit line 51' is used for writing only, and bit line 52' is used for reading only. Therefore, each memory cell can be individually addressed by selecting a word line and one of the two bit lines connected to it. The choice of the bit line depends on whether reading or writing is intended.

Word line driver D1 is adapted to provide a predetermined electrical potential at an output port connected to a selected word line. There may be a difference between the potential applied in a writing process and that applied in the reading process. However, preferably the potential applied to the selected word line is the same irrespective of a write or read process.

Bit line driver D2 is adapted to provide either a predetermined electrical write potential at a write output port connected to a selected write bit line, or a pre-determined electrical read potential at a read output port connected to a selected read bit line. The write potential and read potential are chosen to provide the write current and read voltage described above with reference to FIGS. 2 and 3.

FIG. 5A and FIG. 5B show a second embodiment of a memory cell in the form of a two-terminal device. FIG. 5A shows the general structure of the cell. FIG. 5B shows the memory cell as to be integrated into a memory cell array, i.e., provided with current selection elements. The structure of the memory cell is similar to shown of FIG. 1 and FIG. 3. Therefore, the same reference numerals are used for corresponding layers. The following description concentrates on the structural and operational differences to the earlier embodiment.

In contrast to the embodiment of FIG. 1, the memory cell of FIG. 5A has no bit line integrated into the cell structure. The cell comprises a GMR cell section 10 which is connected to a bit line 68, and an MTJ cell section 20, which is connected to a word line 58. A conductive layer 29 sandwiched between the FMS layers 13 and 23 connects the GMR cell section and the MTJ cell section.

As a difference to the memory cell of FIG. 1, the conductive layer is not shared by any other memory cell. The word line 61 of the cell of FIG. 1 is also a "conductive layer" but is shared by all memory cells connected to it.

As a further difference to the memory cell of FIG. 1, the magnetic moments of FMF layers 11 and 21 are aligned in parallel. However, an alternative embodiment has the same structure, but with an antiparallel alignment of the magnetic moments of these layers. A further difference seen in comparison of the FIGS. 5B and 3 is, that the memory cell as integrated into an array of memory cells has only one current selection element 40'.

In the following, the operation of the memory cell of FIGS. 5A and 5B will be described. The writing operation of the memory cell follows the same general principle as that for the memory cell of FIG. 3. A write current is passed through the cell between bit line 68 and word line 58. The current amount and direction are selected to effect a change of the relative orientation of the FMF layer 11 and the FMS layer 13 by switching the orientation of FMS layer 13. Furthermore, FMS layer 13 and FMS layer 23 are magnetostatically coupled so that they will always be In antiparallel alignment. The write current must also pass the MTJ cell section 20. This is accomplished by applying write voltage high enough to create a potential drop across the thin Insulating (or high-resistance) layer 25 of the MTJ cell section that is high enough to allow the write current amount to pass the barrier potential introduced by the layer 25. The parallel alignment of FMF layers 11 and 21 enhances the support of the write process by spin-polarized electrons. However, the write process also works with an anti-parallel alignment.

For reading the cell, a read voltage is applied to the cell between word line 58 and bit line 68. The read voltage is lower than the write voltage. The read voltage is chosen to have the current flow through the cell influenced strong enough by the spin-valve effect of the magnetic tunnel junction of MTJ cell section 20. This way a contrast between the two alignment states can be detected in an electrical measurement by applying the read voltage across the cell. Since all other layers in the cell are conductive, the influence of these layers on the read current is small in comparison with the influence of the magnetic tunnel junction, so that the of the orientation of the magnetic moments of the further FMF and FMS layers 11 and 13 does not hinder the read operation substantially.

In order to provide the selectivity between read and write operations, current selection element 40' has the following electrical characteristics: It allows a write current amount to flow across the cell at a voltage high enough to cross the tunnel junction. The write current amount necessary has been described above in the context of the description of FIGS. 1 to 4. The write current amount Is allowed to flow in either direction across the cell. The current selection element further allows a read current to flow across the cell in one direction at a predetermined read voltage. The read voltage is smaller than the write voltage. It is chosen small enough to provide read currents, either in a low-resistance or in a high-resistance state of the MTJ cell section, that does not change the orientation of the magnetic moment of the FMS layer 13 or 23.

The embodiment of FIGS. 5A and 5B has the advantage that only one current selection device 40' is needed. Also, this embodiment can rely on known memory circuit architectures for MRAM devices since only one word and bit line are needed per cell.

A further embodiment of the memory cell of the invention will now be described with reference to FIGS. 6A and 6B. Again, the reference numerals used are based on those used for embodiments described above where structural elements are identical.

The following description focuses on the differences to the embodiment of FIGS. 5A and 5B. In the present embodiment, the structure of FMS13, conductive layer 29, and FMS 23 seen in FIG. 5A Is replaced by a single FMS layer 27. This way, the GMR cell section and the MTJ cell section share the same FMS layer.

For writing the cell, a write current is sent through the cell between word line 58 and bit line 68 in a direction depending on the present alignment of FMS layer 27 to FMF layer 11. The write process in this memory cell is supported by spin-polarized electrons from FMF 21 and layer 25 if FMF 21 and FMF 11 have magnetic moments in anti-parallel alignment.

For reading the cell, a read voltage is applied between word line 58 and bit line 68. As described above, the read voltage is chosen to have the current flow through the cell influenced strongly enough by the spin-valve effect of the magnetic tunnel junction of MTJ cell section 20.

For the characteristics of the current selection element 40', reference is made to the description of FIGS. 5a and 5b.

A combination of direct switching and switching by currents passing by the memory cell will now be described with respect to FIG. 7.

The switching of the cell may be supported by one or more additional currents passing by the location of the memory cell. With such additional currents the current led through the memory cell to perform the direct switching may be reduced. For passing the additional currents by the memory cell, either the word lines and the bit lines or additional lines which are specially provided for this task can be used.

FIG. 7 shows a schematic timing diagram for an exemplary process of switching the magnetic moment of a ferromagnetic soft layer in a memory cell, in which the different currents used in the switching process are depicted against time. In total, the switching process takes between 0.2 and 5 ns.

At the beginning of the switching process a current ($I_{HA}$) generating a hard axis field, i.e., a magnetic field In alignment with the direction of the hard axis of the ferromagnetic soft layer, is passed by the memory cell through an appropriate one of the word and the bit line. As the hard axis is perpendicular to the soft axis of magnetisation, the magnetic moment of the ferromagnetic soft layer is substantially rotated out of its previous alignment with the easy axis towards an alignment with the hard axis.

A fast rising current pulse $I_{HA}$ which generates a field approximately twice as strong as the coercive field of the ferromagnetic soft layer is switched off, when the magnetic moment of the ferromagnetic soft layer is rotated in plane by approximately 45 to 135 degrees away from its original position. If such a strong current pulse is applied for longer times, i.e. at least for the time it takes to carry out a 180 degree rotation for the magnetic moments of the ferromagnetic soft layer array wide selectivity is lost which is known as the quasi ballistic time limit for magnetization reversal and of the order of 150 ps for a thin NiFe layer. An alterative would be to apply a weaker current pulse $I_{HA}$ for a longer time that is unable to switch the ferromagnetic soft layer no matter how long the pulse is applied. In addition a much weaker current $I_{EA}$ may be passed by the memory cell generating an easy axis field, i.e. a magnetic field in alignment with the direction of the easy axis of the ferromagnetic soft layer. The magnetic field generated by current $I_{EA}$ tends to rotate the magnetic moment of the ferromagnetic soft layer into alignment with the easy axis of the layer. Depending on the direction of the current $I_{EA}$, the alignment is either rotated towards a parallel or an anti-parallel state with respect to the easy axis and, as a consequence, with respect to the magnetic moment of the ferromagnetic fixed layer. One of both states represents a logical "0" while the other represents a logical "1".

At any time during the switching sequence, i.e., during the flow of current $I_{HA}$ or current $I_{EA}$, a direct current $I_D$ is led through the memory cell to effect the switching of the magnetic moment of the ferromagnetic soft layer into the desired orientation. That is, while $I_{HA}$ serves to disturb the previous alignment at the beginning of the switching sequence, $I_{EA}$ and $I_D$ together will effect the switching into the desired new orientation of the magnetic moment.

The current $I_{EA}$ and the direct current $I_D$ may be set back to zero any time between 0.2 and 5 ns after initiating the switching process, i.e. initiating the direct current and the current $I_{HA}$. There ought to be some temporal overlap between $I_D$ or $I_{EA}$, respectively, and $I_{HA}$.

Next, designs for providing a flux closure be described with respect to FIGS. 8 through 10.

As already mentioned, in an MRAM memory cell the information is stored in terms of parallel or anti-parallel orientation of the magnetic moment of a ferromagnetic soft layer with respect to the magnetic moment of a ferromagnetic fixed layer. When the memory cell is read, i.e., a read voltage is applied across the memory cell, the resistance of the memory cell is lower if both magnetic moments are aligned in parallel orientation and higher if both magnetic moments are aligned in anti-parallel orientation. Therefore, with the read voltage applied across the memory cell, different currents flowing through the cell are sensed in dependence of the information stored in the cell.

However, magnetic fields emerging from neighbouring MRAM memory cells, in particular magnetic stray fields from word and bit lines and neighbouring ferromagnetic hard and soft layers, influence the switching of the ferromagnetic soft layer in the memory cell. If such stray fields are oriented different than the magnetic moment of the ferromagnetic fixed layer to which the ferromagnetic soft layer is aligned, those stray fields could induce domains in the ferromagnetic soft layer which have an orientation which is not in the correct alignment with the ferromagnetic fixed layer. Such domains usually occur in the lateral periphery of the ferromagnetic soft layer, in particular at the corners of the layer and change its coercivity. Therefore, stray fields impair on the switching as they may lead to strong and arbitrary variations in the switching characteristics of the memory cell array.

To address the problem of the ferromagnetic domains in the soft layer as well as the problem of the strong variations in the switching characteristics, various designs of memory cells have been proposed. For example, it has been proposed to give the memory cells an oval shape or a rectangular shape with tapered edges. However, these designs reduce the usable lateral size of the memory cells which negatively effects the integration level of a memory cell array.

Therefore, the present invention proposes a design for a memory cell array in which the formation of domains can be suppressed without negatively affecting the integration level of the memory cell array.

This objective is achieved by providing a flux return structure for closing the flux of the ferromagnetic fixed layers along one dimension and flux closure of the bit and/or write line and ferromagnetic soft layer along a second dimension of MRAM cells, In particular magnetic memory cells as described with respect to FIGS. 1 to 6.

A first design providing a flux closure between two FMS layers is shown in FIG. 8. The embodiment shown in FIG. 8 is based on that of FIG. 3. The view shown in FIG. 8 is a cross sectional view. The sectional plane shown here is perpendicular to that of FIG. 3. In addition to the layer structure explained with reference to FIGS. 1 and 3, the embodiment of FIG. 8 comprises a flux closure structure 110 on the side walls of the memory cell. The flux closure structure extends around all side walls of the memory cell. The flux closure structure extends along the side walls In a direction from the bottom to the top of the cell along the FMS layers 13 and 23 and the word line 61 sandwiched between the FMS layers. However, word line 61 cuts through the flux closure structure 110 in a direction perpendicular to the sectional plane of FIG. 8.

Flux closure structure 110 is made from a soft magnetic insulating material such as a soft ferrite. Alternatively, a thin insulating coating can be provided which is then covered with a soft magnetic metal film such as NiFe (not shown).

By providing flux closure structure 110 the coupling between FMS layers 13 and 23 is enhanced. This makes switching of the FMS layer 13 easier so that the reliability of the switching process is increased and the direct current in the memory cell can be reduced.

A second design providing a flux closure for the bit and/or write line and a ferromagnetic soft layer Is shown in FIG. 9 along a first direction. In FIG. 9 a cross section of a part of inventive memory cell of FIG. 6B is shown comprising bit line 68, FMF layer 11, conductive layer 15, and FMS layer 27. The memory cell is coated with an insulating magnetic material such as a soft ferrite to allow the flux of the ferromagnetic soft layer 27 and the bit line 68 to close during a write process. Alternatively, a thin insulating coating can be provided which is then covered with a soft magnetic metal film such as NiFe (not shown).

A third design providing a flux closure for the ferromagnetic fixed layer is shown in FIG. 10 in a cross sectional view of a memory array along a second direction. Memory cells 301 and 302 are provided based on those shown in FIG. 6B. Word and bit lines are omitted in this view. The memory cells are electrically separated from each other by insulating soft magnetic layers 331, 332 and 333 which may be for example of a soft ferrite, and insulating non-magnetic layers 341, 342 and 343 which may be for example made of $Al_2O_3$. A simplification to the design can be made when using instead of a non-magnetic insulating material the same magnetic material as for layers 331, 332 and 333. At both ends of each row a keeper layer 102 is introduced (shown only for one end). Top insulating soft magnetic layer sections 351, 352 and 353 complete the flux closure for the ferromagnetic fixed layers 11 and 21 in memory cells 301 and 302. This means that the orientation of the magnetic moment of the ferromagnetic fixed layer 11 is the same in all memory cells belonging to a row. Also, FMF layers 11 and 21 have an antiparallel alignment of their respective magnetic moments.

Alternatively, instead of using an insulating soft magnetic material, a thin insulating coating can be provided which is then covered with a soft magnetic metal film such as NiFe (not shown).

What is claimed is:

1. Magnetic memory cell comprising
   a first ferromagnetic fixed (hereinafter FMF) layer with a first magnetic moment,
   a second FMF layer with a second magnetic moment,
   at least one ferromagnetic soft (hereinafter FMS) layer with a third magnetic moment, said FMS layer being arranged between the first and second FMF layers,
   a first non-magnetic intermediate layer arranged between said first FMF layer and said FMS layer,
   and a second non-magnetic intermediate layer arranged between said second FMF layer and said FMS layer,
      wherein said first intermediate layer is adapted to allow a spin-polarized write current to pass between said first FMF layer and said FMS layer, said write current having an amount sufficient to change a relative orientation of said first and third magnetic moments, and
      wherein said second intermediate layer is adapted to influence the resistance between said second FMF layer and said FMS layers at a predetermined read voltage in dependence on a relative orientation of said second and third magnetic moments, said read voltage creating a spin-polarized current amount lower than said write current amount,
      and wherein said first and second magnetic moments are in a predetermined parallel or antiparallel alignment relative to each other.

2. Magnetic memory cell according to claim 1, wherein said first and second magnetic moments are in ant-parallel alignment with each other.

3. Magnetic memory cell according to claim 1, wherein said first and second magnetic moments are in parallel alignment with each other.

4. Memory cell according to claim 1, wherein respective extensions of said first FMF layer, said first intermediate layer, and said FMS layer in a direction perpendicular to the layer planes, as well as the respective materials of these layers are such as to allow a change of an orientation of said first and third magnetic moments relative to each other with the aid of a current of at least said writing current amount.

5. Memory cell according to claim 1, wherein respective extensions of said second FMF layer, said second intermediate layer, and said FMS layer in a direction perpendicular to the layer planes, as well as the respective materials of these layers are such as to form, given a predetermined writing voltage applied across these layers, a low ohmic resistance if the second and third magnetic moments are in parallel alignment, and to form a high ohmic resistance if the second and third magnetic moments are in antiparallel alignment.

6. Magnetic cell according to claim 1, wherein said second FMF layer, said second intermediate layer, and said FMS layer form a magnetic tunnel junction.

7. Magnetic cell according to claim 1, comprising a current selection element adapted to allow a current of up to at least a predetermined writing current amount to pass across the first FMF, the first intermediate layer and the FMS layer in directions perpendicular to the layer planes, and a reading current amount to pass across the first second FMF layer, the second intermediate layer and the FMS layer in one direction perpendicular to the layer planes at a predetermined reading voltage.

8. Magnetic memory cell according to claim 1, comprising a first FMS layer and a second FMS layer, wherein the magnetic moments of said first and second FMS layers are coupled to each other by magnetostatic interaction.

9. Magnetic memory cell according to claim 8, wherein said FMS layers are separated by a conductive layer.

10. Magnetic memory, comprising at least one memory cell according to claim 9, wherein the conductive layer is a word line or a bit line.

11. Magnetic memory cell according to claim 8, comprising a first current selection element and a second current selection element,
   said first current selection element contacting said first FMF layer and
   said second current selection element contacting said second FMF layer,
      wherein said first current selection element is adapted to allow a current of up to at least a predetermined writing current amount to pass across the first FMF, the first intermediate layer and the first FMS layer in directions perpendicular to the layer planes, and
      wherein said second current selection element is adapted to allow a reading current amount to pass across the second FMF layer, the second intermediate layer and the second FMS layer in one direction perpendicular to the layer planes at a predetermined read voltage applied across these layers.

* * * * *